United States Patent
Mariano

(10) Patent No.: US 9,370,923 B1
(45) Date of Patent: Jun. 21, 2016

(54) LIFT TOOL ASSEMBLY FOR STENCIL PRINTER

(71) Applicant: Illinois Tool Works Inc., Glenview, IL (US)

(72) Inventor: Daniel Mariano, Abington, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 14/680,359

(22) Filed: Apr. 7, 2015

(51) Int. Cl.
*B41F 15/18* (2006.01)
*B41F 15/34* (2006.01)
*H05K 3/12* (2006.01)
*H05K 13/00* (2006.01)

(52) U.S. Cl.
CPC .............. *B41F 15/18* (2013.01); *B41F 15/34* (2013.01); *H05K 3/1216* (2013.01); *H05K 13/0069* (2013.01)

(58) Field of Classification Search
CPC .......... B41F 15/18; B41F 15/16; B41F 15/14; B41F 15/34; H05K 3/1216; H05K 13/0069; H05K 13/0061
See application file for complete search history.

(56) References Cited

U.S. PATENT DOCUMENTS

| | | | |
|---|---|---|---|
| 3,777,661 A | 12/1973 | Aiko et al. | |
| 3,874,289 A | 4/1975 | Valentin | |
| 4,924,304 A | 5/1990 | Freeman | |
| 5,060,063 A | 10/1991 | Freeman | |
| 5,176,078 A * | 1/1993 | Homma | B41F 15/12 101/126 |
| RE34,615 E | 5/1994 | Freeman | |
| 5,452,656 A | 9/1995 | Becher et al. | |
| 5,491,871 A | 2/1996 | Reber et al. | |
| 5,669,970 A | 9/1997 | Balog et al. | |
| 5,724,889 A | 3/1998 | Aun et al. | |
| 5,794,329 A | 8/1998 | Rossmeisl et al. | |
| 5,807,606 A | 9/1998 | Mould et al. | |
| 5,813,331 A | 9/1998 | Tan et al. | |
| 5,865,117 A | 2/1999 | Asai et al. | |
| 5,873,939 A | 2/1999 | Doyle et al. | |
| 5,882,720 A | 3/1999 | Legault et al. | |
| 5,918,544 A | 7/1999 | Doyle | |
| 5,925,187 A | 7/1999 | Freeman et al. | |
| 5,941,171 A | 8/1999 | Fromm | |
| 5,943,089 A | 8/1999 | Douglas | |
| 5,947,022 A | 9/1999 | Freeman et al. | |
| 5,991,963 A | 11/1999 | Tourigny | |
| 6,032,577 A | 3/2000 | Doyle | |
| 6,066,206 A | 5/2000 | Doyle et al. | |

(Continued)

FOREIGN PATENT DOCUMENTS

JP 2004020984 A 1/2004

*Primary Examiner* — Matthew G Marini
*Assistant Examiner* — Leo T Hinze
(74) *Attorney, Agent, or Firm* — Lando & Anastasi, LLP

(57) ABSTRACT

A stencil printer includes a frame, a stencil coupled to the frame, and a print head coupled to the frame to deposit and print viscous material over the stencil. The stencil printer further includes a lift table assembly configured to support the substrate in a transport position and a print position, and a conveyor system. The conveyor system includes a pair of rail members coupled to the frame. The pair of rail members extends through the frame and is configured to transport the substrate through the stencil printer. The conveyor system further includes, for each rail member, a lift tool assembly coupled to the rail member. The lift tool assembly is configured to cooperate with the lift table assembly and to engage and support the substrate at a transport height and a print height.

10 Claims, 9 Drawing Sheets

(56) References Cited

U.S. PATENT DOCUMENTS

| | | | |
|---|---|---|---|
| 6,067,709 A | 5/2000 | Godin et al. | |
| 6,189,448 B1 | 2/2001 | O'Neal et al. | |
| 6,207,220 B1 | 3/2001 | Doyle et al. | |
| 6,217,669 B1 | 4/2001 | Sarashina et al. | |
| 6,237,484 B1 | 5/2001 | Homma et al. | |
| 6,267,819 B1 | 7/2001 | Doyle et al. | |
| 6,324,973 B2 | 12/2001 | Rossmeisl et al. | |
| 6,374,729 B1 | 4/2002 | Doyle | |
| 6,453,810 B1 | 9/2002 | Rossmeisl et al. | |
| 6,571,701 B1 | 6/2003 | Pham-Van-Diep et al. | |
| 6,619,198 B2 | 9/2003 | Rossmeisl et al. | |
| 6,626,097 B2 | 9/2003 | Rossmeisl et al. | |
| 6,626,106 B2 | 9/2003 | Peckham et al. | |
| 6,638,363 B2 | 10/2003 | Erdmann | |
| 6,663,712 B2 | 12/2003 | Doyle et al. | |
| 6,738,505 B1 | 5/2004 | Prince | |
| 6,891,967 B2 | 5/2005 | Prince | |
| 6,955,120 B2 | 10/2005 | Pham-Van-Diep et al. | |
| 6,955,121 B2 | 10/2005 | Perault et al. | |
| 7,013,802 B2 | 3/2006 | Marszalkowski, Jr. | |
| 7,017,489 B2 | 3/2006 | Perault et al. | |
| 7,028,391 B2 | 4/2006 | Pham-Van-Diep et al. | |
| 7,040,228 B2 | 5/2006 | Perault et al. | |
| 7,072,503 B2 | 7/2006 | Prince | |
| 7,121,199 B2 | 10/2006 | Perault et al. | |
| 7,149,344 B2 | 12/2006 | Prince | |
| 7,171,898 B2 | 2/2007 | Marszalkowski, Jr. | |
| 7,249,558 B2 | 7/2007 | Claiborne | |
| 7,293,691 B2 | 11/2007 | Rossmeisl et al. | |
| 7,310,438 B2 | 12/2007 | Prince | |
| 7,322,288 B2 | 1/2008 | Marszalkowski, Jr. | |
| 7,458,318 B2 | 12/2008 | Prince | |
| 7,469,635 B2 | 12/2008 | Marszalkowski, Jr. | |
| 7,549,371 B2 | 6/2009 | Willshere et al. | |
| 7,710,611 B2 | 5/2010 | Prince | |
| 7,806,048 B2 | 10/2010 | Doyle | |
| 7,827,909 B2 | 11/2010 | Mattero et al. | |
| 7,861,650 B2 | 1/2011 | Klauser et al. | |
| 7,878,116 B2 | 2/2011 | Barboza et al. | |
| 7,987,781 B2 | 8/2011 | Doyle et al. | |
| 8,191,472 B2 * | 6/2012 | Mizuno | H05K 3/1216 101/123 |
| 8,230,783 B2 | 7/2012 | Klauser et al. | |
| 8,230,784 B2 | 7/2012 | Doyle | |
| 8,230,785 B2 | 7/2012 | Doyle et al. | |
| 8,253,355 B2 | 8/2012 | Mattero et al. | |
| 8,413,577 B2 | 4/2013 | Doyle | |
| 8,413,578 B2 | 4/2013 | Doyle | |
| 8,474,377 B2 | 7/2013 | Doyle | |
| 8,555,783 B2 | 10/2013 | Doyle | |
| 8,555,784 B2 | 10/2013 | Doyle | |
| 8,613,134 B2 | 12/2013 | Doyle | |
| 8,733,244 B2 | 5/2014 | Doyle | |
| 8,739,699 B2 | 6/2014 | Doyle | |
| 8,746,139 B2 | 6/2014 | Doyle | |
| 8,746,142 B2 | 6/2014 | Perault et al. | |
| 8,776,684 B2 | 7/2014 | Doyle | |
| 8,939,073 B2 | 1/2015 | Lynch et al. | |
| 8,939,074 B2 | 1/2015 | Prince | |
| 8,939,076 B2 | 1/2015 | Doyle | |
| 9,060,437 B2 | 6/2015 | Bloom et al. | |
| 9,126,280 B2 | 9/2015 | Lynch et al. | |
| 2001/0017086 A1 | 8/2001 | Takahashi et al. | |
| 2002/0019680 A1 | 2/2002 | Nishikawa et al. | |
| 2002/0148374 A1 | 10/2002 | Peckham et al. | |
| 2003/0021886 A1 | 1/2003 | Baele | |
| 2007/0051253 A1 | 3/2007 | Marszalkowski | |
| 2009/0205569 A1 | 8/2009 | Perault et al. | |
| 2009/0255426 A1 | 10/2009 | Doyle et al. | |
| 2009/0301324 A1 | 12/2009 | Perault et al. | |
| 2010/0125357 A1 | 5/2010 | Doyle | |
| 2013/0333206 A1 | 12/2013 | Doyle | |
| 2014/0347468 A1 * | 11/2014 | Fujimoto | H05K 13/08 348/94 |
| 2015/0090134 A1 | 4/2015 | Li et al. | |

* cited by examiner

LIFT TOOL ASSEMBLY FOR STENCIL PRINTER

BACKGROUND OF THE DISCLOSURE

1. Field of Invention

The present invention relates generally to stencil printers, and more particularly to a lift tool assembly designed to manipulate an electronic substrate, such as a printed circuit board, while performing a stencil printing operation.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying a vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the vision inspection system is further employed to provide a two-dimensional or a three-dimensional inspection of the solder paste on the circuit board.

The stencil cleaning process and the circuit board inspection process are merely two of a number of processes involved in producing circuit boards. To produce the greatest number of circuit boards of consistent quality, it is often desirable to reduce the cycle time necessary to manufacture circuit boards, while maintaining systems that ensure the quality of the circuit boards produced, such as the circuit board inspection and stencil cleaning systems.

SUMMARY OF THE DISCLOSURE

One aspect of the present disclosure is directed to a stencil printer for printing viscous material on a substrate. In one embodiment, the stencil printer comprises a frame, a stencil coupled to the frame, a print head, coupled to the frame, to deposit and print viscous material over the stencil, a lift table assembly configured to support the substrate in a transport position and a print position, and a conveyor system. The conveyor system includes a pair of rail members coupled to the frame. The pair of rail members extends through the frame and is configured to transport the substrate through the stencil printer. The conveyor system further includes, for each rail member, a lift tool assembly coupled to the rail member. The lift tool assembly is configured to cooperate with the lift table assembly and to engage and support the substrate at a transport height and a print height.

Embodiments of the stencil printer further may include configuring the lift tool assembly to engage and support a substrate at a vision system clearance height. The lift tool assembly may include a lifter portion configured to be engaged by a support of the lift table assembly. The lifter portion may include a foot that extends under the rail member, with the foot being configured to be engaged by the support of the lift table assembly. The foot of the lifter portion may contain permanent magnets to couple to the support of the lift table assembly. The lift tool assembly further may include a modular clamping subassembly coupled to the lifter portion. The modular clamping subassembly may include a backplane mounted on a top of the lifter portion. The backplane may have a linear bearing mounted on a back of the backplane to provide a degree of freedom for clamping. The modular clamping subassembly further may include an L-shaped plate mounted on the linear bearing. The L-shaped plate may be configured with a clamping assembly on which flexible steel foils clamp substrate. A clamping force on the substrate may be provided by several pneumatic cylinders. The backplane of the modular clamping subassembly may include a pin configured to be positioned within a locator associated with the rail member.

Another aspect of the disclosure is directed to a method for supporting and clamping a substrate in a print position during a print operation of a stencil printer. In one embodiment, the method comprises: moving the substrate on a conveyor system having a pair of rails at a transport height over a lift table assembly; clamping opposite edges of the substrate; and moving the substrate in a z-axis direction with a lift tool assembly coupled to each rail member.

Embodiments of the method further may include locating a pin associated with the lift tool assembly into a locator associated with the rail member when moving the substrate to the transport height position. Moving the substrate in the z-axis direction may include engaging the lift tool assembly with a support of the lift table assembly. The substrate may be configured to move between a transport height position, a vision system clearance height position and a print height position.

Another aspect of the disclosure is directed to a conveyor system for a stencil printer of the type to print viscous material on a substrate. In one embodiment, the conveyor system comprises a pair of rail members coupled to the frame. The pair of rail members extends through the frame and is configured to transport the substrate through the stencil printer. For each rail member, a lift tool assembly is coupled to the rail member. The lift tool assembly is configured to cooperate with the lift table assembly and to engage and support the substrate at a transport height, a vision system clearance height and a print height.

Embodiments of the conveyor system further may include constructing the lift tool assembly with a lifter portion configured to be engaged by a support of the lift table assembly. The lifter portion may have a foot that extends under the rail member. The foot may be configured to be engaged by the support of the lift table assembly. The lift tool assembly further may include a modular clamping subassembly coupled to the lifter portion, the modular clamping subassembly having a backplane mounted on a top of the lifter portion.

The backplane may have a linear bearing mounted on a back of the backplane to provide a degree of freedom for clamping.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

Figure 1:
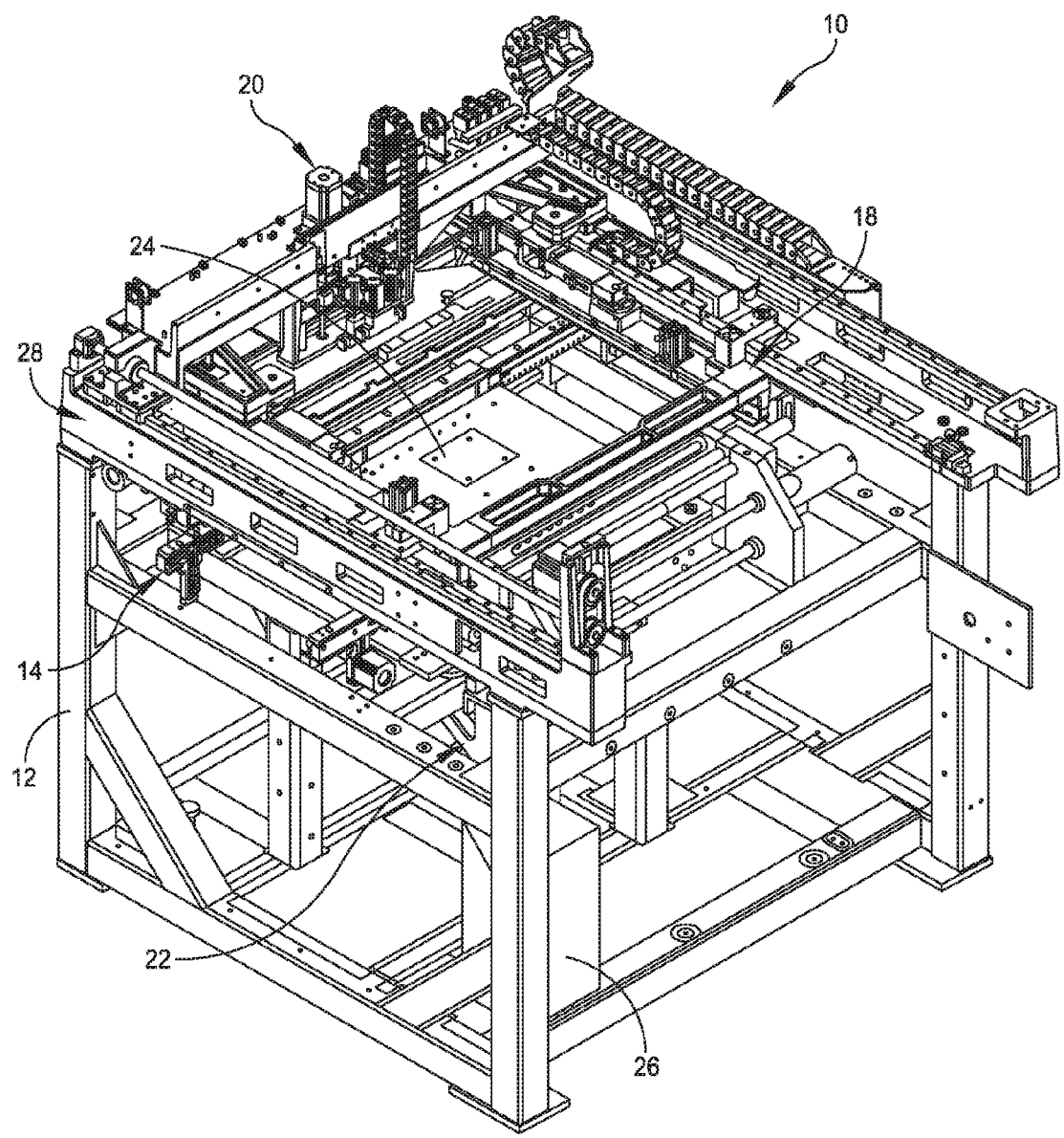
FIG. 1 is a front perspective view of a stencil printer of an embodiment of the present disclosure with external packaging removed to reveal the primary operating systems of the stencil printer.

Referring now to the drawings, and more particularly to FIG. 1, there is generally indicated at 10 a stencil printer of an embodiment of the disclosure. As shown, the stencil printer 10 includes a frame 12 that supports components of the stencil printer. The components of the stencil printer 10 includes, in part, a conveyor system, generally indicated at 14, a stencil shuttle assembly, generally indicated at 18, and a print head assembly or print head, generally indicated at 20, which together are configured to apply viscous materials, including solder paste, in a manner described in greater detail below. The stencil shuttle assembly 18 includes a stencil, which is not shown in FIG. 1 for the purpose of improving clarity.

The stencil printer 10 further includes a lift table assembly, generally indicated at 22, which includes a support surface 24 that is configured to raise a circuit board 16 delivered by the conveyor system 14 from a lower transport position in which the circuit board lies along the same plane as the conveyor system 14 to a raised or print position in which the circuit board engages the stencil. The lift table assembly 22 is further configured to lower the circuit board 16 from the print position back to the lower transport position. The stencil printer 10 further may include a controller 26 and a keyboard and a display (not shown) to enable an operator or assembly system to control the operation of the stencil printer.

Figure 2:
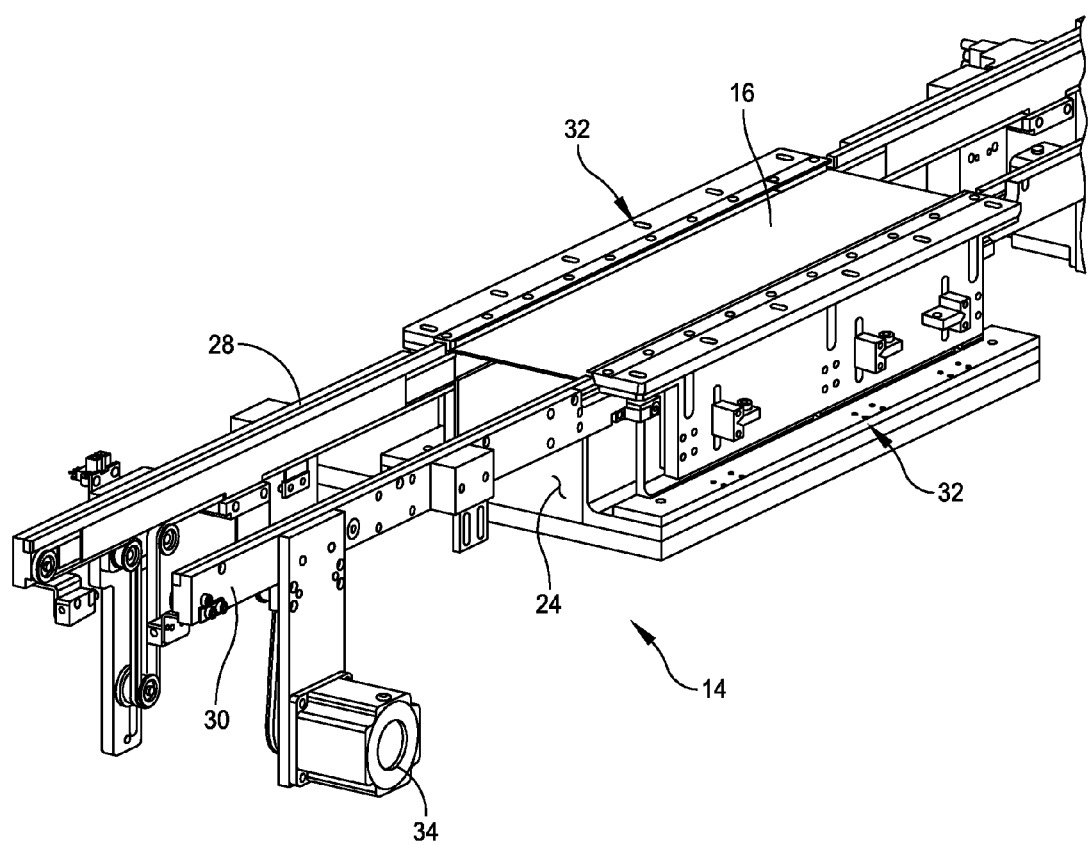
FIG. 2 is a perspective view of a conveyor system of the stencil printer.

Referring to FIG. 2, the conveyor system 14 of the stencil printer 10 includes two transport rail members, generally indicated at 28, 30, to transport the printed circuit board 16 to and from the lift table assembly 22 of the stencil printer. The transport rail members 28, 30 sometimes may be referred to as a "tractor feed mechanism," which together are configured to feed, load or otherwise deliver circuit boards to the working area of the stencil printer 10, which may be referred to herein as a "print nest," and to unload circuit boards from the print nest.

Each transport rail member 28, 30 include a board lifter or lift tool assembly, generally indicated at 32, which is configured to engage and support the edges of the circuit board 16 during a print operation. Each transport rail member 28, 30 further include a motor 34 and a transport belt 36 coupled to the motor. The arrangement is such that the motors 34 of the transport rail members 28, 30 drive the synchronized movement of the transport belts 36 to move the circuit board 16 to and from the print nest under the control of the controller 26.

Figure 3:
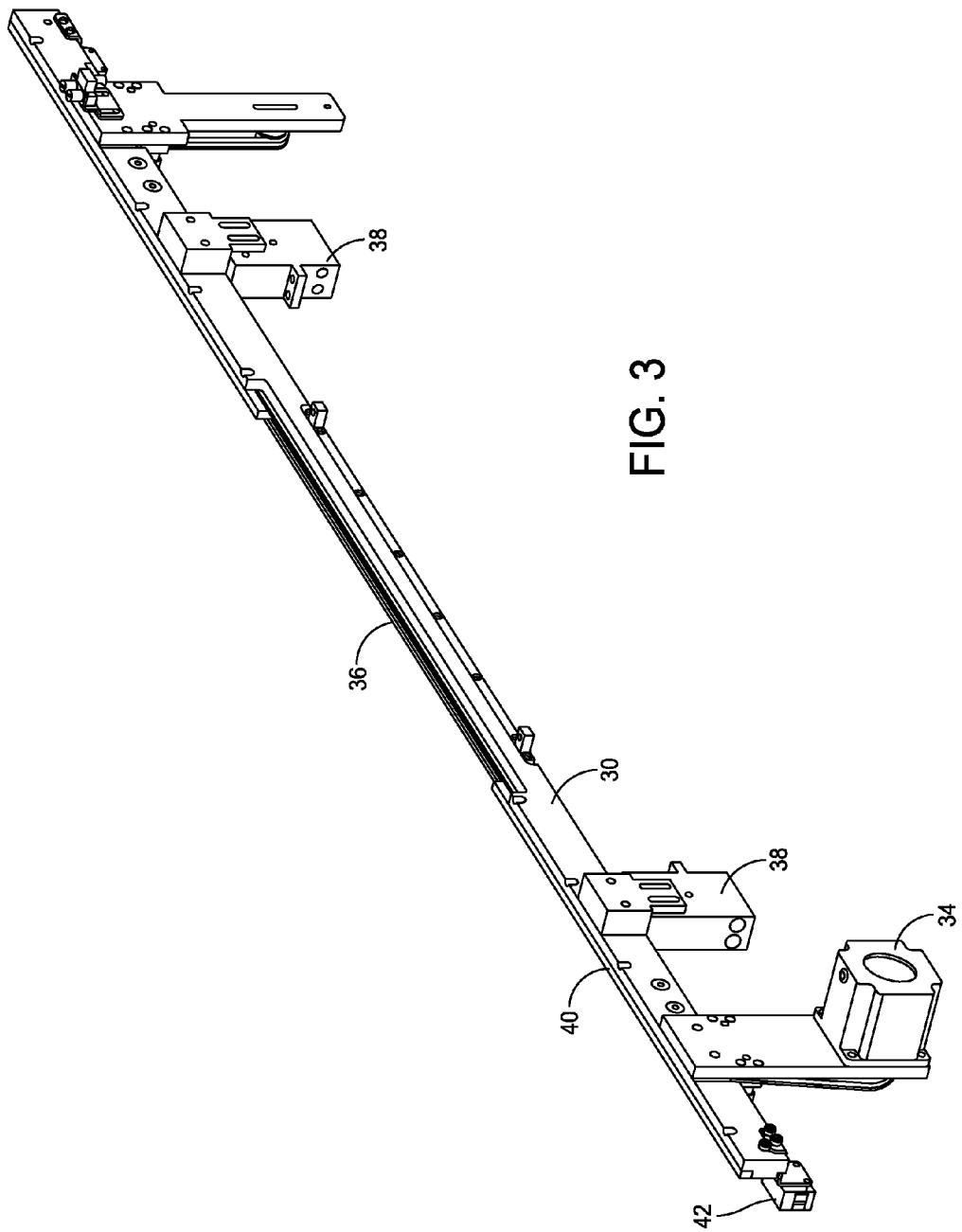
FIG. 3 is a perspective view of a rail member of the conveyor system.

Referring additionally to FIG. 3, which illustrates the transport rail member 28 without the lift tool assembly 32, each transport rail member 28, 30 further includes a pair of rail mounts, each indicated at 38, which connect the transport rail members to the frame 12 of the stencil printer 10, and a board guide 40, which is configured to guide the circuit board along the transport rail member when conveying the circuit board 16. Each transport rail member 28, 30 also includes a sensor 42 to detect when a new circuit board enters the stencil printer 10.

The lift tool assembly 32 is configured cooperate with the support surface 24 of the lift table assembly 22 to engage and support the circuit board 16 at a transport height, a vision system clearance height, and a print height, which will be described in greater detail below. The lift tool assemblies 32 of embodiments of the present disclosure are provided to lift and clamp the circuit board 16 independent of the transport rail members 28, 30 of the conveyor system 14 while the circuit board is at the vision system clearance height and the print height. As referenced above, the lift tool assemblies 32 can achieve a desired fixed z-axis (up/down) height. By decoupling the lift tool assemblies 32 from the transport rail members 28, 30 at a working height makes the lift tool assemblies dependant on the lift table assembly 22 position and eliminates influence and interaction from a second source, such as the transport rail members. Precise and repeatable positioning of the lift tool assemblies 32 provides the operator of the stencil printer 10 with the ability to print features with smaller dimensions and finer pitch with less waste. The lift tool assemblies 32 of embodiments of the present disclosure fit around their respective stationary transport rail members 28, 30. In a certain embodiment, the lift tool assemblies 32 can achieve one of three z-axis (height) positions; however, any desired z-axis height may be achieved.

Figure 4:
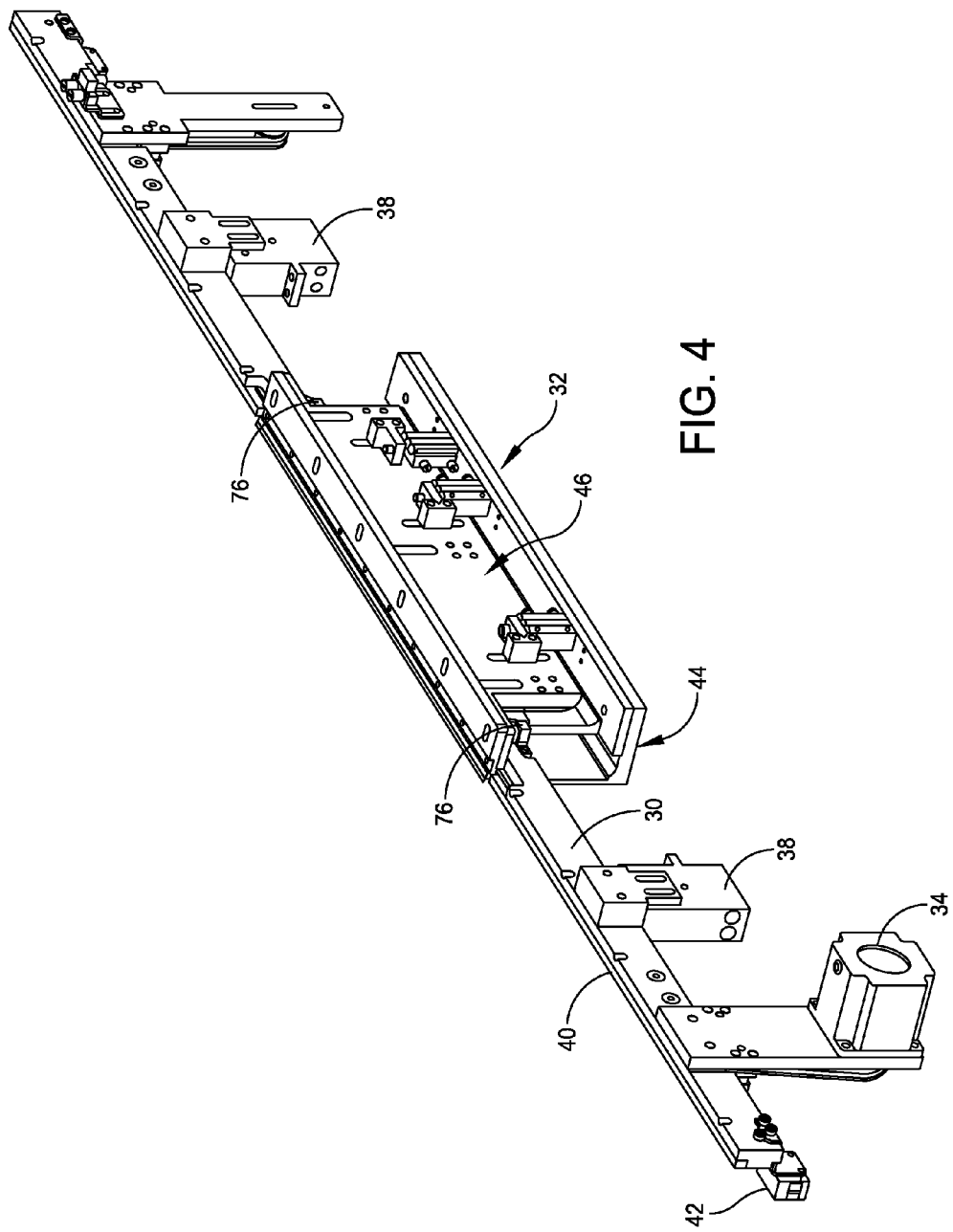
FIG. 4 is a perspective view of the rail member shown in FIG. 3 having a lift tool assembly of an embodiment of the disclosure provided on the rail member, with the lift tool assembly being shown at a transport height.
Figure 5:
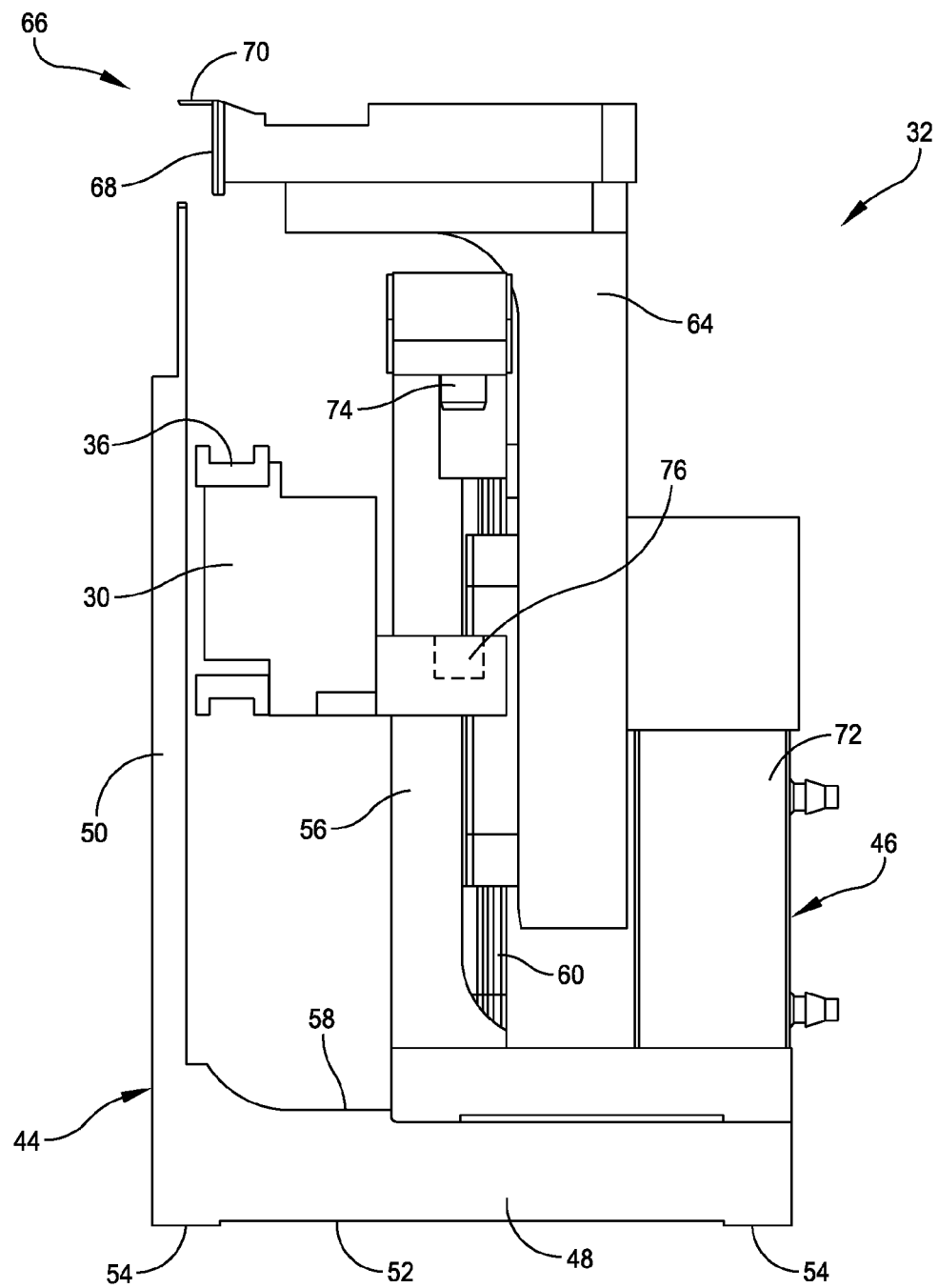
FIG. 5 is a cross-sectional view of the lift tool assembly.

Referring additionally to FIGS. 4 and 5, each lift tool assembly 32 includes a lifter portion, generally indicated at 44, which is configured to be engaged by the support surface 24 of the lift table assembly 22, and a modular clamping subassembly, generally indicated at 46, coupled to the lifter portion. As shown, the lifter portion 44 is generally L-shaped member including a horizontally extending foot 48 that extends under the transport rail member 30 and the modular clamping subassembly 46, and vertically extending arm 50 that extends upwardly at an edge of the foot. The foot 48 includes a bottom surface 52 that faces the support surface 24 of the lift table assembly 22. As shown, the bottom surface 52 of the foot 48 includes several standoffs, each indicated at 54, which are configured to be engaged by the support surface 24 of the lift table assembly 22. In one embodiment, each standoff 54 of the foot 48 is configured to contain a permanent magnet to more firmly secure the support surface 24 of the lift table assembly 22 to the lift tool assembly 32.

The modular clamping subassembly 46 includes a backplane 56 mounted on a top surface 58 of the foot 48 of the lifter portion 44. As shown, the backplane 56 has a linear bearing 60 mounted on a back of the backplane 56 to provide a degree of freedom for clamping. The modular clamping subassembly 46 further includes an L-shaped plate 64 mounted on the linear bearing 60 of the backplane 56. The L-shaped plate 64 is configured with a clamping assembly generally indicated at 66 on which flexible steel foils clamp substrate. As shown, the clamping assembly 66 includes a clamping member 68 having a vertical surface that engages an edge of the circuit board 16 and a thin foil 70 disposed above the clamping member. As shown, the thin foil 70 extends horizontally from the clamping member 68. The clamping assembly 66 further includes several pneumatic cylinders, each indicated at 72, which are designed to move the L-shaped plate 64 to apply a clamping force on the circuit board 16 during operation. To ensure that the lift tool assembly 32 is positioned correctly with respect to its respective transport rail member 30, the backplane 56 of the modular clamping subassembly 46 includes several location pins, each indicated at 74, that are configured to be positioned within respective locators, each indicated at 76, associated with the transport rail member. The locator pins 74 are designed to fit within respective openings provided in the locators 76.

To achieve a desired transport height, the lift tool assembly 32 waits for a circuit board 16 to be loaded from a left/right position to center of the stencil printer 10. In this neutral, non-operational position, the location pins 74 and the locators 76 set/reset the position of the lift tool assembly 32 with respect to the transport rail member 28 or 30 with every circuit board 16 to an approximate position to accept a new circuit board.

To achieve a vision system clearance height, after the circuit board 16 has been positioned, the support surface 24 of the lift table assembly 22 moves upward to engage the foot 48 of the lifter portion 44 of the lift tool assembly 32, at which time the pneumatic cylinders 72 of the clamping assembly 66 clamp the circuit board. At a z-axis position suitable for a vision system of the stencil printer 10 to travel between the circuit board 16 and the lift table assembly 22, referred to herein as the vision system clearance position, the locating pins 74 of the transport rail members 28, 30 are no longer in contact with their respective locators 76 of the lift tool assembly 32. In this position, there is sufficient clearance between lift tool assembly 32 and the transport rail members 28, 30 so there is no contact, interference or influence from the transport rail members imparted on the lift tool assembly.

To achieve a print height from the vision system clearance height position, the lift tool assembly 32, which is magnetically coupled to the lift table assembly 22, moves upwardly to the print height position. Contact between lift tool assembly 32 and transport rail members 28, 30 remains decoupled, which eliminates influence from transport rail members.

Figure 6:
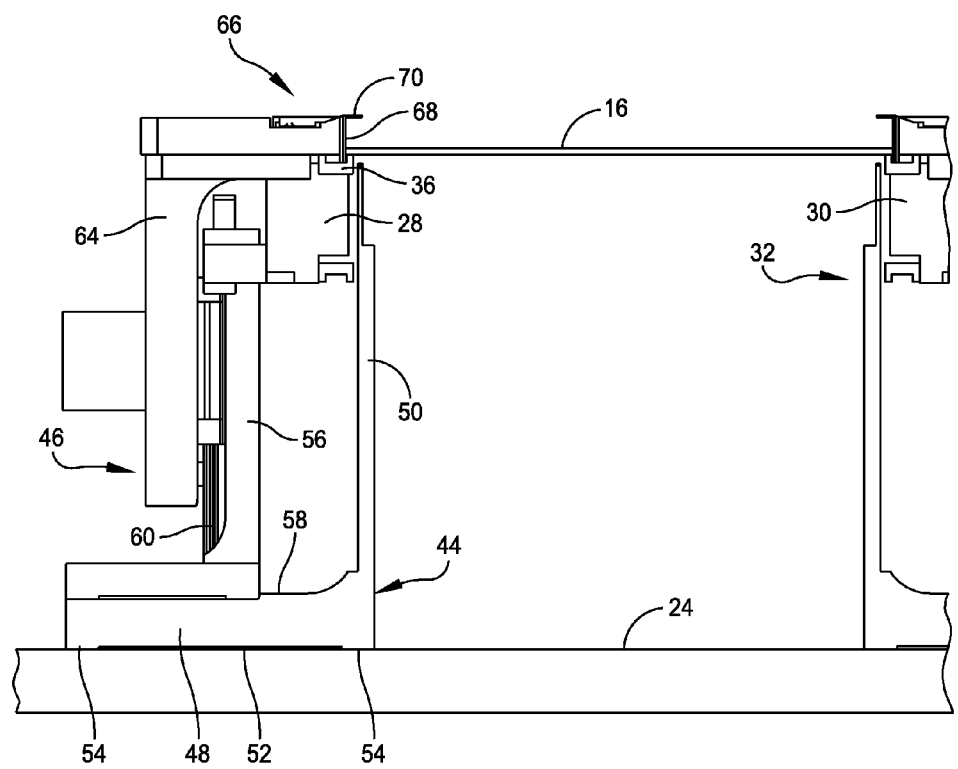
FIG. 6 is a cross-sectional view of the conveyor system with the lift tool assembly being shown at the transport height.
Figure 7:
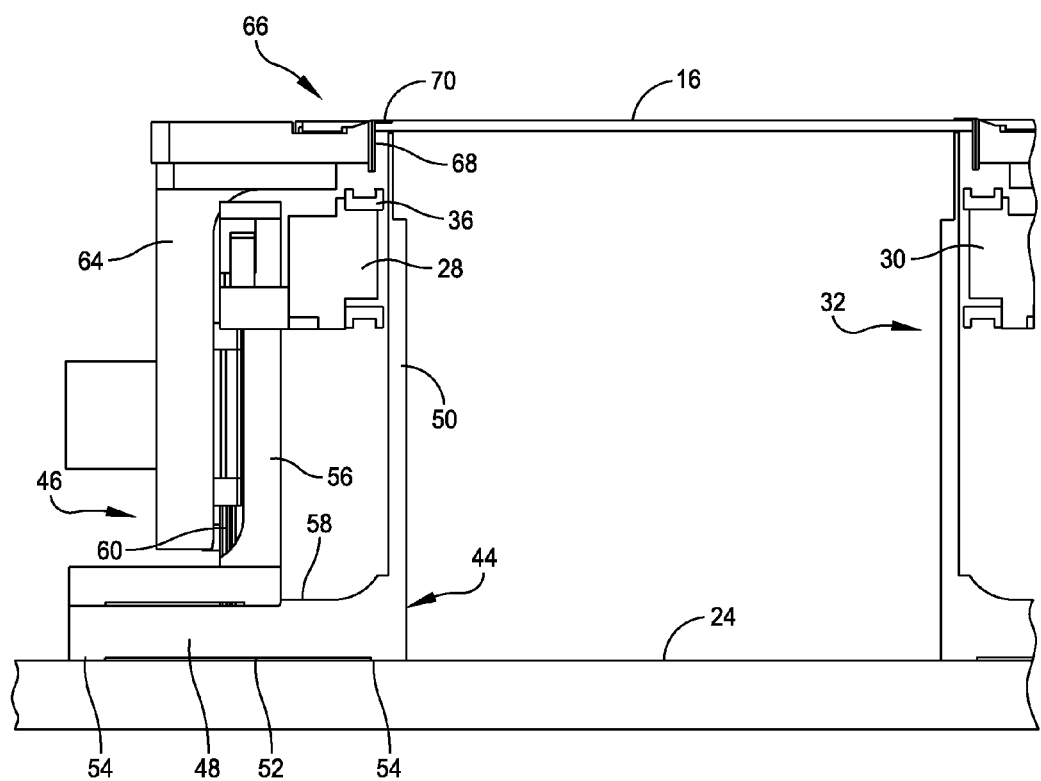
FIG. 7 is a perspective view of the conveyor system with the lift tool assembly being shown at a vision system inspection height.
Figure 8:
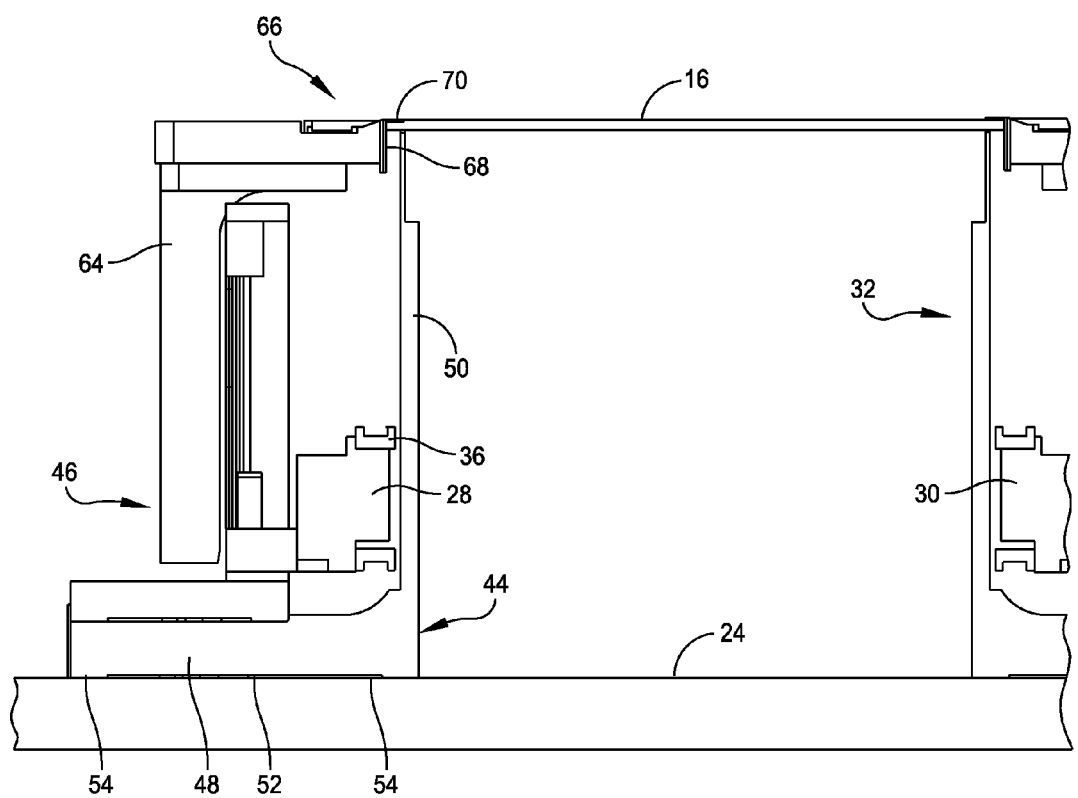
FIG. 8 is a perspective view of the conveyor system with the lift tool assembly being shown at a print height.

FIG. 6 illustrates the lift tool assembly 32 supporting the circuit board 16 at the transport height at which the circuit board is transported into the stencil printer 10. FIG. 7 illustrates the lift tool assembly 32 supporting the circuit board 16 at the vision system clearance height at which the vision system is configured to move between the circuit board and the stencil to align the circuit board with the stencil. And FIG. 8 illustrates the lift tool assembly 32 supporting the circuit board 16 at the print height at which a print operation takes place.

Once a print operation is complete, the circuit board 16 returns to the transport height for loading/unloading circuit boards.

Possible variations of the lift tool assembly 32 may include but is not limited to varying a length of the lift tool assembly. In one embodiment, the lift tool assembly 32 is 400 millimeters in length. A variety of circuit board thicknesses can be accommodated.

Figure 9:
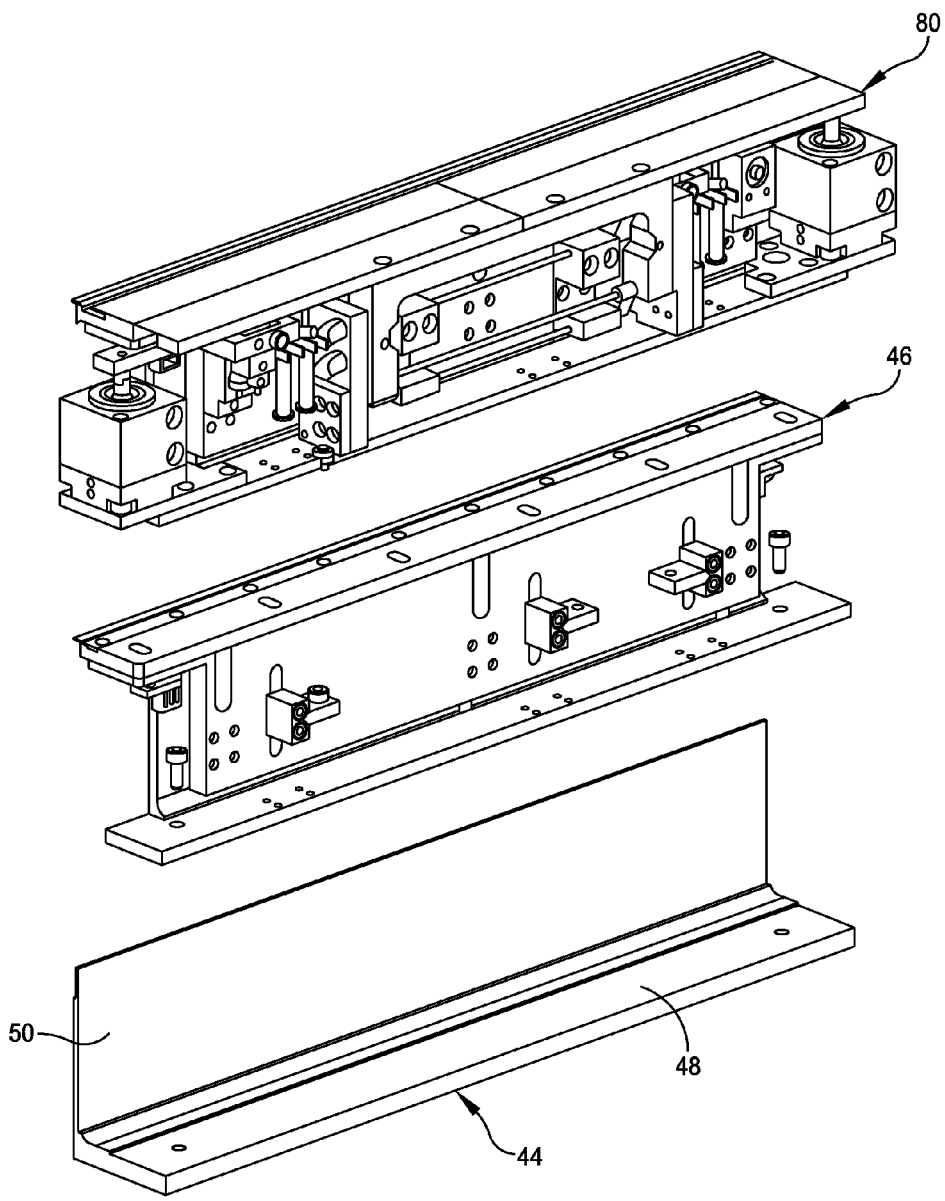
FIG. 9 is an exploded perspective view of the lift tool assembly having one of a foil clamping system and a customized board clamping system.

In addition to passive foil clamping, the backplane can be removable to provide for active clamping in the form of another clamping mechanism, such as an EDGELOC™ board clamping system, making the lift tool assembly modular and with the ability to be modified in the field. FIG. 9 illustrates the lifter portion 44 spaced from a modular clamping assembly 46 embodying the modular clamping subassembly 46 embodying the foil clamping assembly 66. However, another modular clamping assembly, generally indicated at 80, such as the EDGELOC™ board clamping system, may be used in place of the modular clamping assembly 46.

Advantages of the lift tool assembly over the previous designs include but are not limited to the decoupling of lift tool assembly from its respective transport rail member for more precision and repeatability in process. Modularity and the ability to alternately switch from the passive foil clamping system to the active EDGELOC™ board clamping system and back to enhance to customers ability to customize processes. Because the transport rail members are stationary in the z-axis (height), circuit boards can be staged prior to the lift tool assembly.

It should be observed that the conveyor system embodying the lift tool assembly is capable of handling the circuit boards inside the stencil printer. This consists of loading, printing, and unloading of circuit boards.

Each transport rail member is divided roughly into three equal sections. The left and right sections of each rail member are minors of each other, capable of handling the loading and unloading of boards. The center section of each transport rail member is where the circuit board is aligned for printing and moved in an upward direction for printing. The center section of the transport rail member having the lift tool assembly is moved upward by the lift table assembly, or other suitable lifting platform. The lift table assembly has at least two functions—to provide a shelf/platform for tooling that acts as a board support to prevent board sagging of the circuit board during printing, and to provide for moving the tool lift assembly upward, in this sense the lift tool assembly moves the entire circuit board when moving the lift table assembly.

The lift tool assembly enables minimal interaction of the lift table assembly and the transport rail member when the lift table assembly moves up and engages the lift tool assembly. One advantage of maintaining the transport rail members stationary in the vertical z-axis direction is that circuit boards can be loaded and unloaded while simultaneously printing a circuit board in the center section, thereby improving cycle time.

This provision of the lift tool assembly design also allows for modular functional options. The lift tool assembly enables a more modular design allowing for standardization in the factory with the possibility of customization at the customer site.

The lift tool assembly is designed to be a self-contained tool that rides on a main beam which is common to all options provided for the stencil printer. In order to better understand the functionality of the lift tool assembly, the transfer rail members each functions as a beam and the lift tool assembly functions as a tube. The lift tool assembly surrounds the transfer rail member and rides/rest on top of the transfer rail member. As the support surface of the lift table assembly moves up to engage the lift tool assembly, the lift tool assembly no longer touches the transfer rail member on any surface. At this point in the process, the lift tool assembly is only referenced to the support surface of the lift table assembly by way of the bottom surface of the lift tool assembly. This arrangement eliminates a secondary rail/beam reference by way of linear bearings which may distort or constrain the lift tool assembly resulting in imprecise alignment. After printing is complete, the lift table assembly and the lift tool assembly are lowered to position the circuit board back into its neutral transport position for unloading out of the stencil printer.

Options for the conveyor system include a lift tool assembly that can accommodate a passive clamping system or an active clamping system. Two other options, which are independent of each other and the lift tool assembly, are staging assemblies, which can be attached to the back of the transport rail members on the left and/or right sections of the rail. The staging assemblies can be combined with optional hard stops as well.

Embodiments are not limited in their application to the details of construction and the arrangement of components set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A stencil printer for printing viscous material on a substrate, the stencil printer comprising:
   a frame;
   a stencil coupled to the frame;
   a print head, coupled to the frame, to deposit and print viscous material over the stencil;
   a lift table assembly configured to support the substrate in a transport position and a print position; and
   a conveyor system including
      a pair of rail members coupled to the frame, the pair of rail members extending through the frame and being configured to transport the substrate through the stencil printer, and
      for each rail member, a lift tool assembly movable with respect to the rail member, the lift tool assembly being configured to cooperate with the lift table assembly and to engage and support the substrate at a transport height and a print height, the lift tool assembly including a lifter portion configured to be engaged by a support of the lift table assembly and a modular clamping subassembly coupled to the lifter portion, the modular clamping subassembly including a backplane mounted on a top of the lifter portion, the backplane having a linear bearing mounted on a back of the backplane to provide a degree of freedom for clamping.

2. The stencil printer of claim 1, wherein the lift tool assembly further is configured to engage and support a substrate at a vision system clearance height.

3. The stencil printer of claim 1, wherein the lifter portion includes a foot that extends under the rail member, the foot being configured to be engaged by the support of the lift table assembly.

4. The stencil printer of claim 3, wherein the foot of the lifter portion contains permanent magnets to couple to the support of the lift table assembly.

5. The stencil printer of claim 1, wherein the modular clamping subassembly further includes an L-shaped plate mounted on the linear bearing.

6. The stencil printer of claim 5, wherein the L-shaped plate is configured with a clamping assembly on which flexible steel foils clamp substrate.

7. The stencil printer of claim 6, wherein a clamping force on the substrate is provided by several pneumatic cylinders.

8. The stencil printer of claim 1, wherein the backplane of the modular clamping subassembly includes a pin configured to be positioned within a locator associated with the rail member.

9. A conveyor system for a stencil printer of the type to print viscous material on a substrate, the conveyor system comprising:
   a pair of rail members coupled to a frame, the pair of rail members extending through the frame and being configured to transport the substrate through the stencil printer; and
   for each rail member, a lift tool assembly movable with respect to the rail member, the lift tool assembly being configured to cooperate with a lift table assembly and to engage and support the substrate at a transport height, a vision system clearance height and a print height, the lift tool assembly including a lifter portion configured to be engaged by a support of the lift table assembly and a modular clamping subassembly coupled to the lifter portion, the modular clamping subassembly having a backplane mounted on a top of the lifter portion, the backplane having a linear bearing mounted on a back of the backplane to provide a degree of freedom for clamping.

10. The conveyor system of claim 9, wherein the lifter portion has a foot that extends under the rail member, the foot being configured to be engaged by the support of the lift table assembly.

* * * * *